United States Patent
Greiser et al.

(10) Patent No.: US 11,067,650 B2
(45) Date of Patent: Jul. 20, 2021

(54) ENCLOSURE FOR AN MR LOCAL COIL

(71) Applicant: Siemens Healthcare GmbH, Erlangen (DE)

(72) Inventors: Andreas Greiser, Erlangen (DE); Stephan Zink, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/581,668

(22) Filed: Sep. 24, 2019

(65) Prior Publication Data

US 2020/0096582 A1 Mar. 26, 2020

(30) Foreign Application Priority Data

Sep. 25, 2018 (DE) .................. 10 2018 216 365.0

(51) Int. Cl.
*G01R 33/34* (2006.01)
*G01R 33/3415* (2006.01)

(52) U.S. Cl.
CPC ... *G01R 33/34007* (2013.01); *G01R 33/3415* (2013.01); *G01R 33/34084* (2013.01)

(58) Field of Classification Search
CPC .......... G01R 33/34007; G01R 33/3415; G01R 33/34084
See application file for complete search history.

(56) References Cited

U.S. PATENT DOCUMENTS

| | | | |
|---|---|---|---|
| 7,826,887 B2 | 11/2010 | Driemel | |
| 8,244,328 B2 | 8/2012 | Biber | |
| 9,285,440 B2 | 3/2016 | Driemel | |
| 2006/0208734 A1* | 9/2006 | Xue | G01R 33/341 324/318 |
| 2012/0286784 A1 | 11/2012 | Driemel | |
| 2015/0057527 A1 | 2/2015 | Driemel | |
| 2015/0057528 A1 | 2/2015 | Driemel | |

FOREIGN PATENT DOCUMENTS

| | | |
|---|---|---|
| DE | 102011075454 | 7/2016 |
| EP | 2504063 B1 | 7/2018 |

OTHER PUBLICATIONS

GE Healthcare "Perforated Blanket Coil" Source: https://www.gehealthcare.com/products/magnetic-resonance-imaging/air-technology/air-technology-coilsDate Accessed: Jan. 14, 2020.
Wayne Forrest "GE Unveils New Lightweight, Flexible MR Coil Technology" dated Nov. 22, 2017 Source: https://www..auntminnie.com/index.aspx?sec=prtf&sub=def&pag=dis&itemId=119063&printpage=true&fsec=sup&fsub=mri.
Examination Report 06172019, cited in the corresponding German application No. 10 2018 216 365.0; dated Jun. 17, 2019; 6 pp.

\* cited by examiner

*Primary Examiner* — G. M. A Hyder
(74) *Attorney, Agent, or Firm* — Lempia Summerfield Katz LLC

(57) ABSTRACT

An enclosure for a magnetic resonance (MR) local coil and an MR local coil including the enclosure are provided. The enclosure has a first enclosure shell and a second enclosure shell. The first enclosure shell is arranged opposite the second enclosure shell. The enclosure is configured such that an MR local coil is positionable between the first enclosure shell and the second enclosure shell.

18 Claims, 7 Drawing Sheets

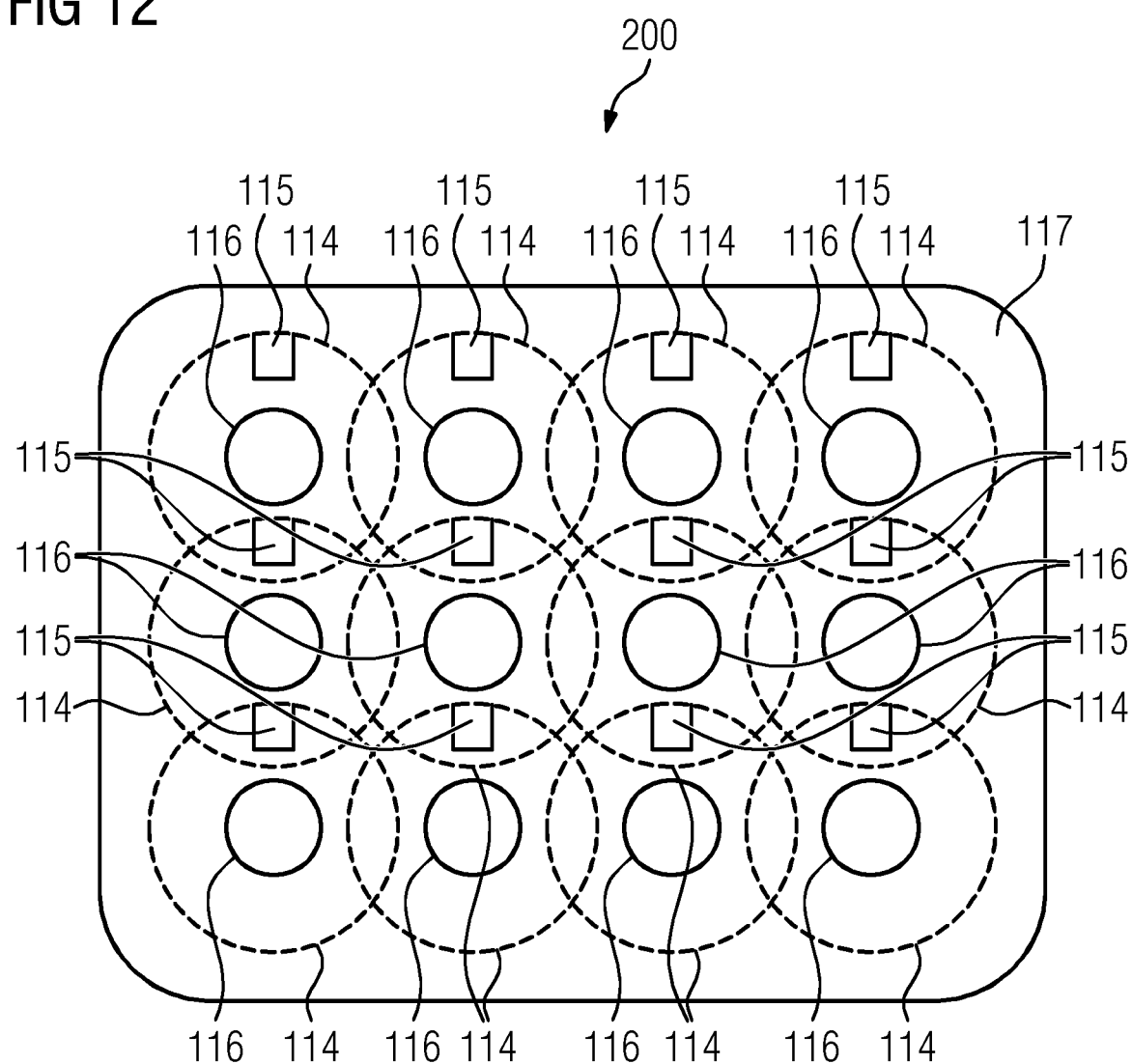

ENCLOSURE FOR AN MR LOCAL COIL

This application claims the benefit of DE 10 2018 216 365.0, filed on Sep. 25, 2018, which is hereby incorporated by reference in its entirety.

BACKGROUND

The present embodiments relate to an enclosure for a magnetic resonance (MR) local coil and to an MR local coil.

In medical technology, high soft-tissue contrasts are a particular feature of imaging using MR, also known as magnetic resonance imaging (MRI). A magnetic resonance apparatus is used in this process to expose a subject under examination (e.g., a patient) to excitation pulses. This triggers magnetic resonance signals in the patient. The magnetic resonance signals are received as scan data by the magnetic resonance apparatus and used to reconstruct magnetic resonance images.

The magnetic resonance signals are often received using what are known as MR local coils, otherwise often known as surface coils. These are usually antenna systems that are attached in the immediate vicinity of the patient. Examples of conventional MR local coils are described in U.S. Pat. Nos. 9,285,440 B2, 7,826,887 B2, US 20150057527 A1, US 20150057528 A1, or U.S. Pat. No. 8,244,328B2.

The whole surface of the enclosure of an MR local coil is conventionally connected in a fixed manner to the inner workings of the MR local coil (e.g., any coil elements and/or electronic components). By way of example, the MR local coil includes an upper foam layer and a lower foam layer. The upper foam layer and the lower foam layer are attached together thermally and/or by an adhesive. This makes maintenance or repair work on the MR local coil more difficult.

SUMMARY AND DESCRIPTION

The scope of the present invention is defined solely by the appended claims and is not affected to any degree by the statements within this summary.

The present embodiments may obviate one or more of the drawbacks or limitations in the related art. For example, maintenance or repair work on a magnetic resonance (MR) local coil may be made easier.

An enclosure that has a first enclosure shell and a second enclosure shell is provided. The first enclosure shell is arranged opposite the second enclosure shell. For example, the first enclosure shell and the second enclosure shell may be arranged parallel to one another. The enclosure may be configured such that an MR local coil may be positioned (e.g., inserted) between the first enclosure shell and the second enclosure shell.

The enclosure shell may be, for example, a skin (e.g., an outer skin) of the enclosure. In one embodiment, the gap between the first enclosure shell and the second enclosure shell is significantly smaller (e.g., ten times smaller) than an extension of the enclosure shell perpendicular to the distance vector between the first enclosure shell and the second enclosure shell.

Enclosures configured in this way are suitable for flat (e.g., flexible) MR local coils that may be arranged around the patient, for example.

The first enclosure shell has at least one first cut-out, and the second enclosure shell has at least one second cut-out.

A cut-out may, for example, be a hole and/or a perforation and/or an opening in the enclosure shell. The cut-outs may possibly allow for a better circulation of air.

The cut-outs may be circular, for example. A circular shape allows the enclosure shells to be particularly evenly tensioned. However, the cut-outs may also have a different shape (e.g., a rectangular, rounded-rectangular, oval, and/or polygonal shape). In one embodiment, the cut-outs each have an area of more than 1 cm$^2$ (e.g., more than 10 cm$^2$). In one embodiment, the cut-outs each have an area of less than 150 cm$^2$ (e.g., less than 80 cm$^2$). For example, the area of a cut-out may be delimited by an area described by a coil element of an MR local coil.

In one embodiment, the first cut-out and the second cut-out are arranged so as, for example, to be substantially congruent with one another. The aeration may be improved even further as a result.

In one embodiment, the enclosure has at least one connecting unit that is configured to connect a periphery of the at least one first cut-out to a periphery of the at least one second cut-out detachably (e.g., in a reversible and/or non-destructive manner). In one embodiment, the cut-outs may then be opened and closed repeatedly.

The periphery typically delimits the respective cut-out. The connecting unit may include a zip fastening and/or a hook-and-loop fastening, for example, in order to connect the peripheries detachably.

In one embodiment, such a connection allows the peripheries of the enclosure to be closed. An uncovering of any coil elements and/or electronic components of the MR local coil may be prevented as a result when the MR local coil is arranged on the enclosure. Hygiene and patient safety when the MR local coil is used may be increased as a result.

In one embodiment, the enclosure is configured to be arranged detachably on the MR local coil. As such, the patient advantageously comes into direct contact at most with the enclosure of the MR local coil. Since the enclosure may be removed from the MR local coil, the enclosure may be cleaned more easily than if the enclosure is connected in a fixed manner to the MR local coil. In this case, the enclosure may therefore also be regarded as a removable cover and/or casing for the MR local coil.

In one embodiment, the enclosure, when the enclosure is arranged on the MR local coil, encloses electronic components of the MR local coil, such as coil elements and/or electronic circuits (e.g., preamplifiers and/or detuning circuits). One potential advantage is better protection of the electronic components against external influences, such as liquids.

In one embodiment, the enclosure may have one or more openings in order to make it possible to place the MR local coil into the enclosure and/or to remove the MR local coil from the enclosure. These one or more openings may be closed, for example, with the aid of a zip fastening and/or a hook-and-loop fastening.

In one embodiment, not the whole enclosure, but merely a part of the enclosure, is configured to be detachable from the MR local coil. For example, the enclosure may be configured such that only peripheries of the cut-outs are detachable from one another, so that the peripheries may be opened reversibly.

Whether the enclosure is configured to be fully or merely partially detachable, one possible advantage is that the enclosure may be opened, for example, for service purposes. For example, if an MR local coil surrounding the enclosure is damaged (e.g., the electronics or cabling), repair work, for example, may be performed outside of the production location directly on the premises of the user of the MR local coil.

The enclosure may have a haptically pleasant surface including, for example, a textile material. In one embodiment, the surface of the enclosure is easy to clean. In one embodiment, the enclosure consists of a washable material.

The enclosure may be configured to be flexible so that advantageously the enclosure may adjust well to the contour of the patient.

A further embodiment of the enclosure provides that the at least one connecting unit has a first connecting element arranged at the periphery of the at least one first cut-out, and has a second connecting element arranged at the periphery of the at least one second cut-out. For example, the first connecting element and the second connecting element may be configured to be annular. The first connecting element and the second connecting element may include plastic or may be made of plastic, for example.

For example, one part of a zip fastening may be arranged on the periphery of the at least one first cut-out, and a corresponding part of the zip fastening may be arranged on the periphery of the at least one second cut-out.

According to a further example, a loop material of a hook-and-loop fastener may be arranged on the periphery of the at least one first cut-out, and a hook material of the hook-and-loop fastener may be arranged on the periphery of the at least one second cut-out.

These examples represent particularly simple possibilities for connecting the peripheries detachably.

A further embodiment of the enclosure provides that the first connecting element has a first thread and the second connecting element has a second thread configured as a mating thread to the first thread. A connection may be established and also detached again quickly and reliably using a thread.

For example, the first thread may be screwed into the second thread. For example, the first thread is an external thread, and the second thread is a matching internal thread.

The thread path of the thread then advantageously extends along the periphery of the respective cut-out. For example, the thread path of the thread extends parallel to the periphery of the respective cut-out.

In this case, the thread path of the first thread and the second thread need not necessarily extend over a whole circumference of the periphery, and it is instead also possible, for example, that the thread path is interrupted in the circumferential direction.

A further embodiment of the enclosure provides that the at least one connecting unit has a bayonet fastening and/or a screw-cap fastening in order to connect the first connecting element to the second connecting element detachably.

A bayonet fastening (e.g., a bayonet catch) allows a mechanical connection of the connecting elements that may be quickly established and/or detached. The connecting elements may be connected by fitting one into the other and then rotating, and are separated in the same way.

A screw-cap fastening (e.g., a screw cap) is sometimes also referred to as a twist-off fastening. In the case of a screw-cap fastening, the screw-cap elements, which are subjected to a spring tension after the fastening is closed, effect a particularly firm connection of the connecting elements.

A further embodiment of the enclosure provides that the first connecting element includes a first edge. The second connecting element includes a second edge. In a connected state, the first edge is encircled within the second edge.

The first edge may be connected in a single piece to the first enclosure shell, and/or the second edge may be connected in a single piece to the second enclosure shell. For example, the edges and the enclosure shells may be made of the same material.

The first edge may be a separate part affixed to the first enclosure shell, and/or the second edge may be a separate part affixed to the second enclosure shell. The edges may be affixed to the enclosure shells by bonding, thermal joining, and/or a hook-and-loop fastening.

The first and/or the second edge may include a peripheral thickening and/or a peripheral reinforcement and/or a flange. For example, the first edge and/or the second edge may include a beading. The beading may include an elastic material (e.g., rubber, foam, a stretchable textile). The beading may be worked into and/or bonded into and/or sewn into and/or cast into and/or thermally imprinted into the enclosure shell.

One possible advantage is that the connection that is produced by the edges being encircled may be made more stable as a result.

The first edge and/or the second edge may have an elasticity in terms of stretching and compression in order to facilitate the encircling of the first edge within the second edge.

The first edge (e.g., the first periphery) may have a greater circumference and/or a lower elasticity than the second edge (e.g., the second periphery). The first edge may be encircled within the second edge more easily as a result.

The second edge or the first edge may have a bulge that is configured to accommodate the opposing edge such that in a connected state, the opposing edge is arranged in the bulge.

A further embodiment of the enclosure provides that the at least one connecting unit includes a frame with a groove. In a connected state, the first connecting element and the second connecting element are arranged in the groove.

The frame is advantageously adjusted geometrically for the cut-out. The frame may extend along the periphery of the respective cut-out such that the shape of the frame corresponds to the shape of the cut-out.

The groove may be open in an opposite direction to the center of the frame. The frame with the groove may be regarded, for example, as a rim, of which the rim flanges that delimit the groove face outward.

The interior of the frame or rim may be rounded because a patient may come into contact with the interior of the frame or rim.

A further embodiment of the enclosure provides that the first connecting element includes a first clamping profile. The second connecting element includes a second clamping profile corresponding to the first clamping profile. In a connected state, the first clamping profile is clamped in the second clamping profile.

The arrangement of the clamping profiles may be regarded, for example, as a clip, in which the first clamping profile may be clipped into the second clamping profile such that a reversible form-fit connection is produced.

The clamping profile may be bonded to and/or thermally joined to and/or attached with a hook-and-loop fastening to the enclosure shell. The clamping profile may extend along the periphery of the respective cut-out such that the shape of the clamping profile corresponds to the shape of the cut-out.

A further embodiment of the enclosure provides that the at least one connecting unit is configured to be moved from a separated state into a connected state and/or from a connected state into a separated state with the aid of a tool.

For example, a suitable clasp mechanism may be used. If the use of a tool is necessary for the purpose of separation, an undesired opening of the connecting elements while using the MR local coil may be avoided advantageously.

A further embodiment of the enclosure provides that the at least one connecting unit is configured to be at least partially flexible (e.g., soft). For example, the at least one connecting unit may be wholly or partially made of rubber. One possible advantage is that, as a result, the at least one connecting unit may follow the contour of the patient when the MR local coil is being used.

A further embodiment of the enclosure provides that the enclosure has a central plane between the first enclosure shell and the second enclosure shell. The connecting unit is configured to be asymmetrical relative to the central plane when the first connecting element is connected to the second connecting element.

For example, the overall height and/or convexness of the connecting element on the side facing the patient is less than the overall height and/or convexness of the connecting element facing away from the patient. One possible advantage is that patient comfort may then be increased, as the patient comes into contact less strongly, or not at all, with the connecting element facing him or her. In addition, the gap between any coil elements of the MR local coil of the patient surface may also be minimized advantageously, which may lead to an improved signal-to-noise ratio.

An MR local coil having at least one coil element and an enclosure as discussed above and below is also provided. The aforementioned properties and advantages of the enclosure may be transferred to the MR local coil having an enclosure.

The MR local coil may be configured to be flexible and/or flat. For example, the MR local coil may be bent in at least one direction. In one embodiment, the coil elements of the MR local coil may also be bent. A flat MR local coil may be an MR local coil, the coil elements of which are arranged adjacent to one another so as to be flat. For example, the MR local coil may be configured in the form of a cover, in which the coil elements are arranged inside the cover.

One embodiment of the MR local coil provides that the at least one first cut-out and/or the at least one second cut-out is arranged within an area that is delimited by a coil element of the MR local coil. For example, in a projection plane, the projections of the at least one first cut-out and/or of the at least one second cut-out lie within the projection of the coil element of the MR local coil.

A coil element has, for example, the shape of a loop. The loop shape may describe a circle, for example. The projections of the cut-outs lie, for example, within these circles described by the loop shapes of the coil elements.

For example, the at least one first cut-out and/or the at least one second cut-out may each be arranged concentrically in relation to a coil element. A particularly large area overall may then contribute to the aeration of the MR local coil.

The MR local coil may include a support structure on which the at least one coil element is arranged (e.g., in a fixed manner).

A projection of the cut-out of the support structure of the MR local coil may lie on a projection plane, lying parallel to the surface of the support structure, within a projection of the at least one first cut-out and/or of the at least one second cut-out of the enclosure on this projection plane.

One embodiment of the MR local coil provides that the MR local coil includes a support structure on which the at least one coil element is arranged (e.g., in a fixed manner). The support structure includes at least one cut-out arranged substantially concentrically in relation to the at least one first cut-out and/or to the at least one second cut-out of the enclosure shells.

The MR local coil may include a first gap layer and a second gap layer. The first gap layer is arranged between the first enclosure shell and the support structure. The second gap layer is arranged between the second enclosure shell and the support structure.

The at least one first cut-out and/or the at least one second cut-out of the enclosure shells are substantially congruent with the cut-out of the support structure of the MR local coil.

The cut-outs allow for a particularly good aeration of the MR local coil. The provided enclosure allows for a simplified assembly of the MR local coil. For example, any gap layers may be centered better by a correspondingly prefabricated enclosure. The positioning of the gap layers in the assembly process may be simplified.

BRIEF DESCRIPTION OF THE DRAWINGS

Further advantages, features, and details of the invention are disclosed in the exemplary embodiments described below and the drawings. Parts that correspond to one another are provided with the same reference characters in all the figures.

FIG. 12 shows one embodiment of an MR local coil with multiple coil elements and cut-outs.

DETAILED DESCRIPTION

Figure 1:
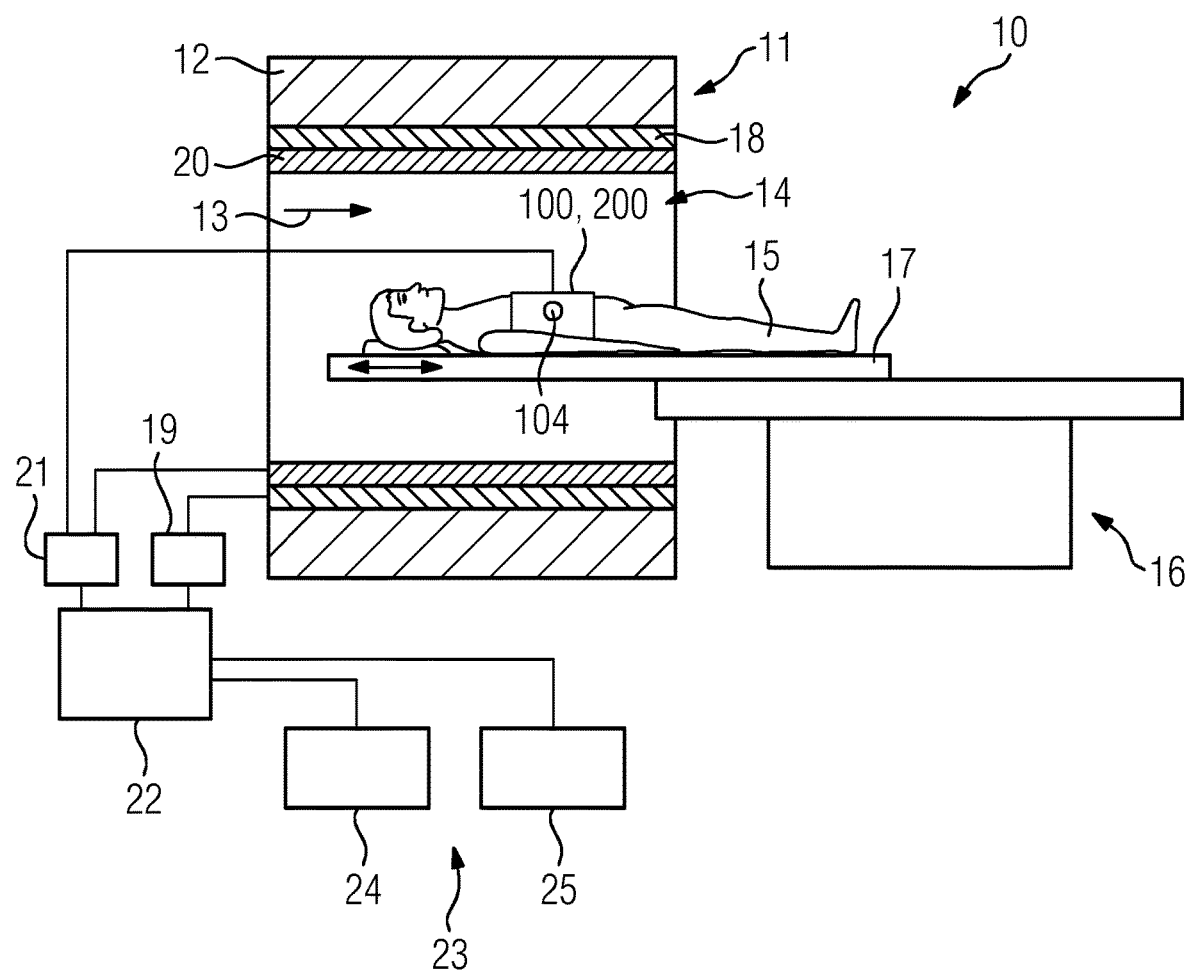
FIG. 1 shows a schematic representation of one embodiment of a magnetic resonance apparatus.

FIG. 1 shows a schematic representation of one embodiment of a magnetic resonance apparatus 10. The magnetic resonance apparatus 10 includes a magnet unit 11 that has a main magnet 12 for generating a powerful main magnetic field 13 that is, for example, constant over time. The magnetic resonance apparatus 10 also includes a patient placement zone 14 for accommodating a patient 15. In the present exemplary embodiment, the patient placement zone 14 is shaped as a cylinder and is enclosed in a circumferential direction cylindrically by the magnet unit 11. In principle, however, the patient placement zone 14 may have a different design. The patient 15 may be moved into the patient placement zone 14 by a patient support apparatus 16 of the magnetic resonance apparatus 10. The patient support apparatus 16 has, for this purpose, a patient couch 17 that is configured to be able to move inside the patient placement zone 14.

The magnet unit 11 further includes a gradient coil unit 18 for generating magnetic field gradients that are used for spatial encoding during imaging. The gradient coil unit 18 is controlled by a gradient control unit 19 of the magnetic resonance apparatus 10. The magnet unit 11 also includes a radiofrequency antenna unit 20 that, in the present exemplary embodiment, is configured as a body coil that is fixedly integrated in the magnetic resonance apparatus 10. The radiofrequency antenna unit 20 is configured to excite atomic nuclei. The excitation is established in the main magnetic field 13 produced by the main magnet 12. The radiofrequency antenna unit 20 is controlled by a radiofrequency antenna control unit 21 of the magnetic resonance apparatus 10 and radiates high-frequency magnetic resonance sequences into an examination space that is largely formed by a patient placement zone 14 of the magnetic resonance apparatus 10. The radiofrequency antenna unit 20 is also configured to receive magnetic resonance signals. The magnetic resonance apparatus 10 also includes a magnetic resonance (MR) local coil 200 with an enclosure 100 arranged detachably thereon. The MR local coil is configured to send high-frequency magnetic resonance sequences and/or receive magnetic resonance signals. The sending and/or receiving of the signals is done using coil elements (not shown in FIG. 1) that act as antennas. The MR local coil 200 is flexible and flat so that the MR local coil 200 may follow a contour of the body of the patient 15 well. Cut-outs 104 provide for better dissipation of heat from the patient 15.

The magnetic resonance apparatus 10 includes a system control unit 22 for controlling the main magnet 12, the gradient control unit 19, and the radiofrequency antenna control unit 21. The system control unit 22 centrally controls the magnetic resonance apparatus 10 (e.g., the execution of a pre-determined imaging gradient echo sequence). The system control unit 22 includes an evaluation unit (not shown in detail) for evaluating medical image data that is acquired during the magnetic resonance examination. In addition, the magnetic resonance apparatus 10 includes a user interface 23 that is connected to the system control unit 22. Control information such as, for example, imaging parameters and reconstructed magnetic resonance images may be displayed on a display unit 24 (e.g., on at least one monitor) of the user interface 23 for medical operating personnel. In addition, the user interface 23 has an input unit 25 by which information and/or parameters may be input by the medical operating personnel during a scanning procedure.

Figure 3:
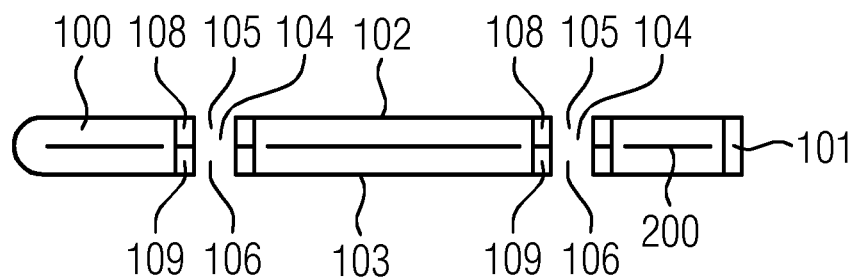
FIG. 3 shows a cross-section through one embodiment of an enclosure with a magnetic resonance (MR) local coil with two cut-outs.

FIG. 3 shows a cross-section through an enclosure 100 for an MR local coil 200. The enclosure is configured to be arranged detachably on the MR local coil 200. For this purpose, the enclosure includes, for example, an opening 101 that may be closed.

The enclosure 100 has a first enclosure shell 102 and a second enclosure shell 103. The first enclosure shell 102 is arranged opposite the second enclosure shell 103.

Figure 2:
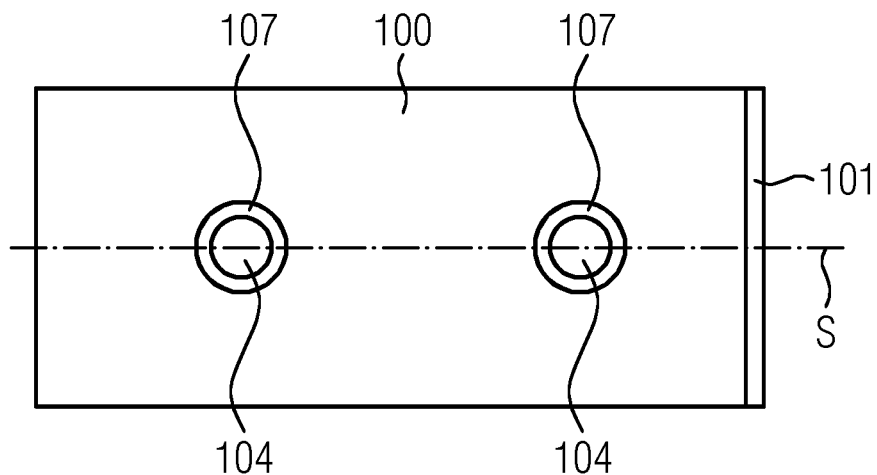
FIG. 2 shows a plan view of one embodiment of an enclosure with two cut-outs.
Figure 4:
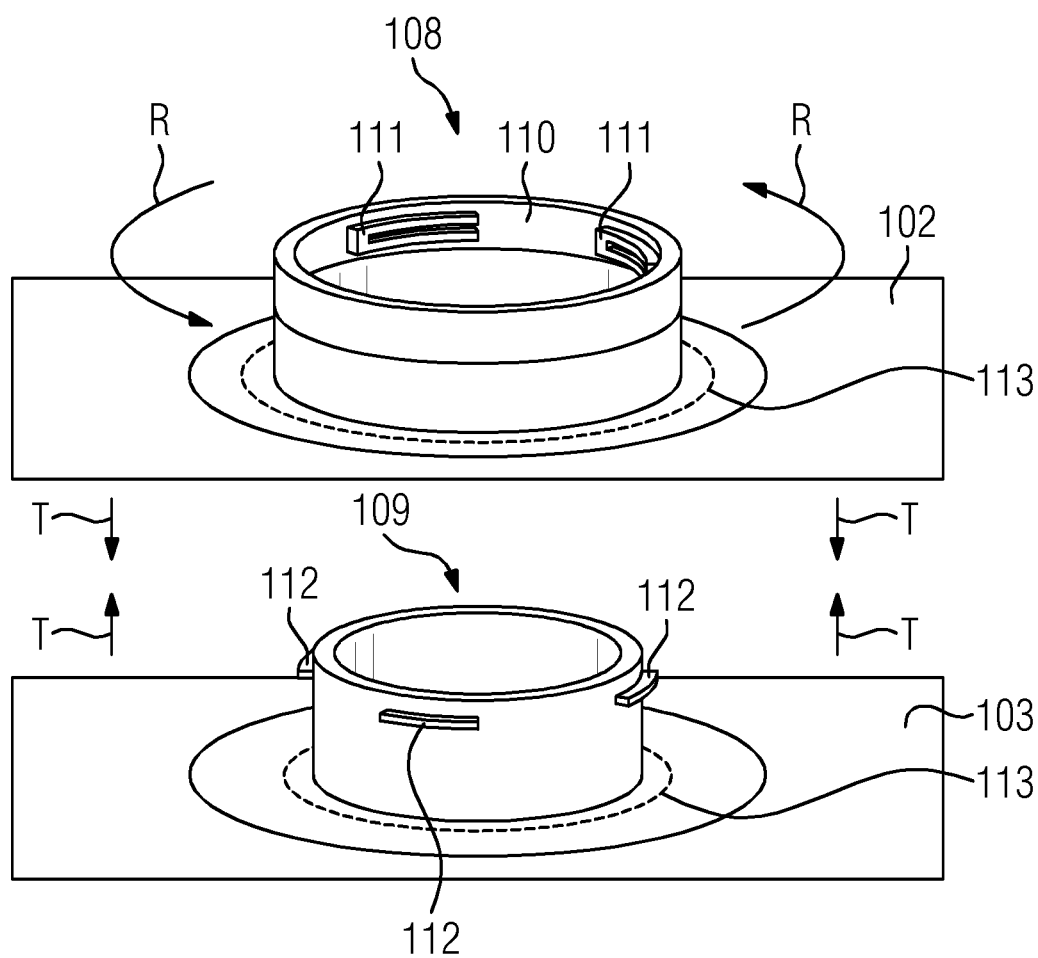
FIG. 4 shows an exemplary connecting element with a bayonet fastening.

FIG. 2 shows a plan view of an enclosure with two cut-outs 104. The cross-section in FIG. 4 shows that the first enclosure shell 102 has two first cut-outs 105 and the second enclosure shell 103 has two second cut-outs 106. The first cut-outs 105 and the second cut-outs 106 are arranged, for example, so as to be congruent with one another. In each case, a first cut-out 105 and a second cut-out 206 form a cut-out 104.

As shown in FIGS. 2 and 3, the enclosure 100 includes two connecting units 107 each configured to detachably connect a periphery of the one first cut-out 105 to a periphery of the at least one second cut-out 106. Each connecting unit 107 may be configured to be at least partially flexible.

The connecting units 107 each include a first connecting element 108 arranged at the periphery of a first cut-out 105, and a second connecting element 109 arranged at the periphery of a second cut-out 106.

The connecting units 107 may be configured such that the first connecting element has a first thread and the second connecting element has a second thread configured as a mating thread to the first thread. The connection may be established by screwing together the threads. The connection may be detached again by a rotational movement in the opposite direction.

The connecting unit 107 may have a screw-cap fastening and/or a bayonet fastening, as shown in FIG. 4, in order to detachably connect the first connecting element 108 to the second connecting element 109.

The first connecting element 108 and the second connecting element 109 are fitted one into the other for the purpose of the connection; see arrow T. The first connecting element 108 of the bayonet fastening has a rotatable ring 110 on which bayonet edges 111 are arranged. The second connecting element 109 has corresponding bayonet edges 112. By rotating the ring 110 (see arrow R), the bayonet edges 111, 112 interlink so that a connection is established.

The first connecting element 108 is connected to the first enclosure shell 102. The first connecting element 109 is connected to the second enclosure shell 103. In each case, the connection is achieved with the aid of a welded joint, as indicated in FIG. 5 by welding lines 113.

When the first connecting element 108 is connected to the second connecting element 109, the connecting unit (e.g., the connecting elements 108, 109) is configured to be asymmetrical relative to a central plane lying between the enclosure shells 102, 103. As such, the connecting elements may protrude upwards out of the first enclosure shell 102, but not downwards out of the second enclosure shell 103. As a result, during an MR examination the second enclosure shell 103 may be brought particularly close to the patient.

The first connecting element 108 and/or the second connecting element 109 may be configured, for example, such that the first connecting element 108 and/or the second connecting element 109 may only be connected to one another and/or separated from one another with the aid of a tool.

Figure 5:
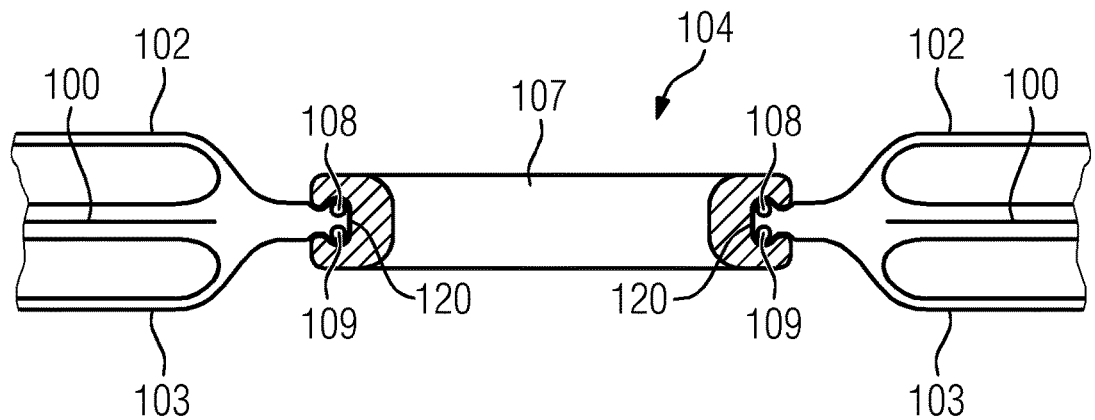
FIG. 5 shows one embodiment of a connecting unit with a frame.

FIG. 5 shows one embodiment of a connecting unit 107 with a frame. The frame has a groove in which a first connecting element 108 and a second connecting element 109 are arranged.

A bendable but solid ring that is constructed like a rim may be used as the frame. The interior of the rim then represents the inner wall of the cut-out 104 and may be rounded because the patient may come into contact with the inner wall of the cut-out 104. During an assembly of an MR local coil, the enclosure shells 102, 103 may be hooked into the groove extending around the outside.

The connecting elements 108, 109 may have a beading. During the manufacture, the enclosure shells 102, 103 may be prepared such that the beading is worked in at the points where cut-outs will be produced later. In one embodiment, the beading consists of an elastic material (e.g., rubber, foam, stretchable material) and is worked into and/or bonded into and/or sewn into and/or cast into and/or thermally imprinted into the enclosure shells 102, 103. The enclosure shells 102, 103 are closed or opened in the vicinity of the cut-outs by the beading being stretched and pulled onto or off the rim. In one embodiment, the opening is configured to be circular, as this allows the resulting forces on the rim to be set optimally. However, other rounded-rectangular, oval, but also polygonal shapes may also be provided. In order to design the rim to be as invisible as possible, a height or thickness that is as low as possible may be provided. Since the rim may also provide planar reinforcement of the whole coil, multiple openings may be provided rather than one large opening. The outside diameter of the rim may be 10 cm or less.

Figure 6:
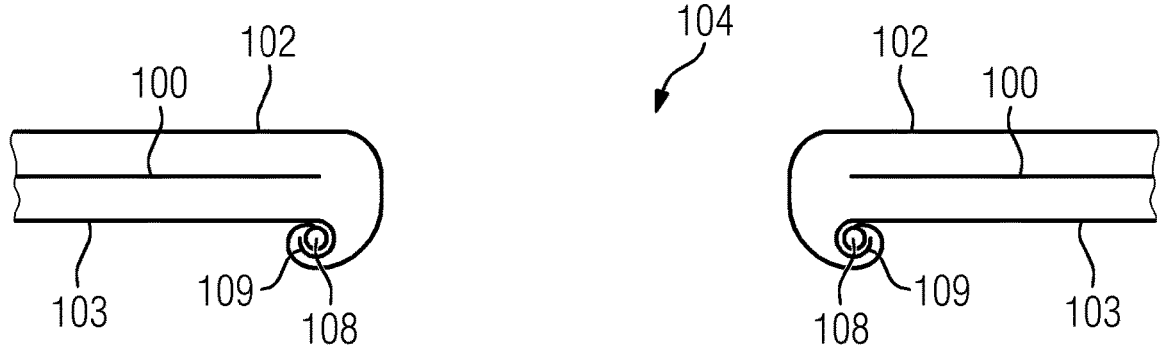
FIG. 6 shows one embodiment of a connecting element with a bulge.
Figure 7:
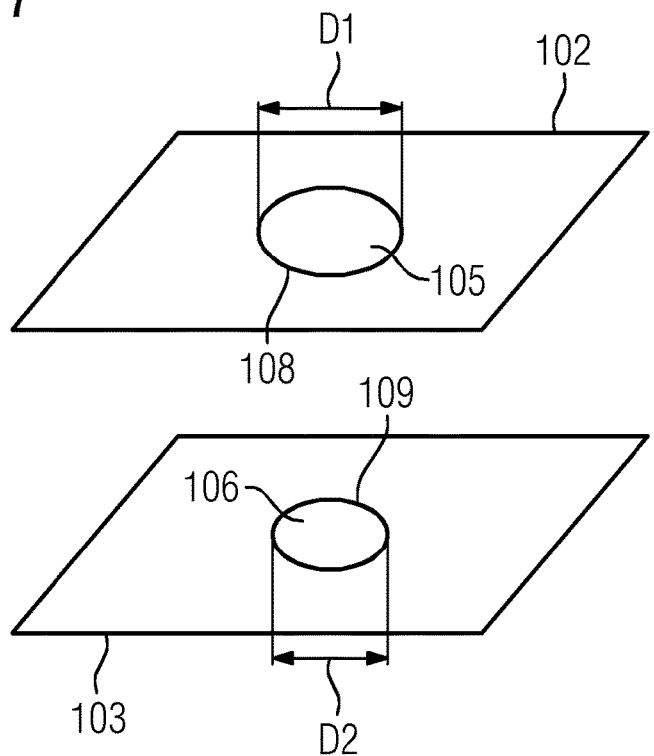
FIG. 7 shows exemplary connecting elements with edges having differing circumferences.
Figure 8:
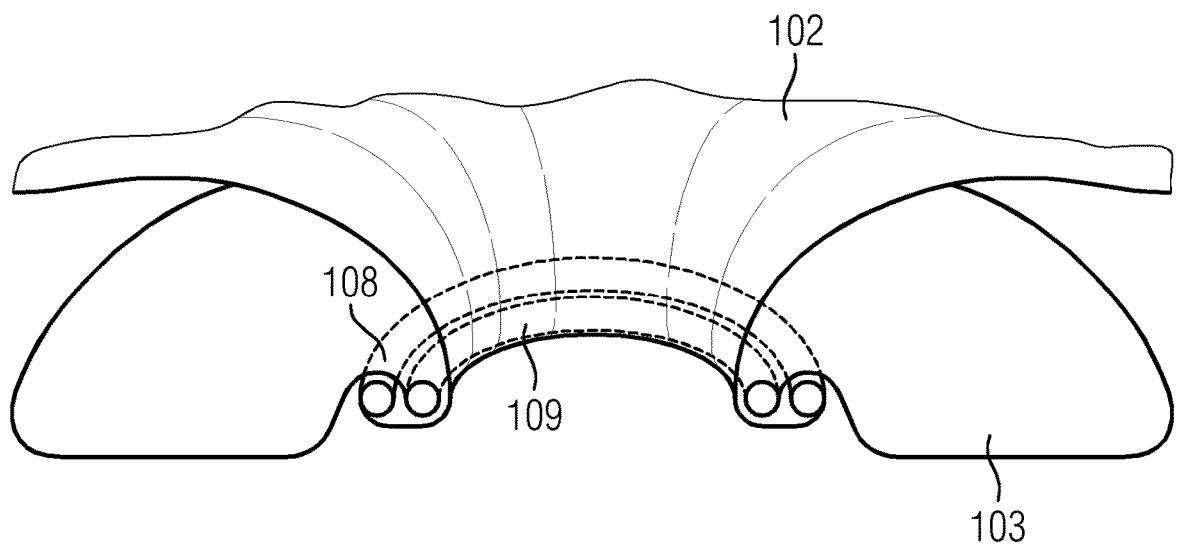
FIG. 8 shows exemplary connecting elements with edges having differing circumferences, in a connected state.

FIGS. 6-8 show an embodiment of an enclosure 200 around an MR local coil 100, in which the first connecting element 108 includes a first edge and the second connecting element 109 includes a second edge. In a connected state, the first edge is encircled by the second edge.

In FIG. 6, the second connecting element 109 has an edge with a bulge that is configured to accommodate the opposing first connecting element 108. The first connecting element 108 may have an edge with a beading. In a connected state, the beading is arranged in the bulge. The beading may be attached, for example, in accordance with the description for FIG. 5.

In FIGS. 7-8, the enclosure shells 102, 103 have circular cut-outs 105, 106. The diameter D1 of the first cut-out 105 of the first enclosure shell 102 may be larger than the diameter D2 of the second cut-out 103 of the second enclosure shell. The connecting elements 108, 109 may each include a beading, each of which form a ring.

In order to attach the enclosure to the MR local coil, the connecting element 108 may be deformed so as to be oval and guided through the connecting element 109. When the connecting element 108 spreads out again, a residual tension of the connecting element 108 causes the connecting element 108 to lie outside the connecting element 109, and the cut-out is closed, as shown in FIG. 8. Opening involves compressing the connecting element 108 and passing the connecting element 108 back out again.

The connecting element 108 may be, for example, the same size as, or smaller than, the connecting element 108. In this case, the connecting element 108 is more elastic than the connecting element 109 (e.g., the connecting element 108 has a higher elasticity than the connecting element 109). The connecting element 108 may then slide behind the connecting element 109 on the underside of the MR local coil and catch there.

Figure 9:
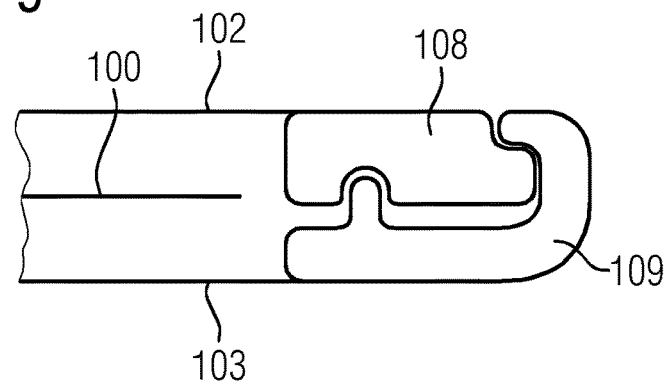
FIGS. 9-11 show exemplary connecting elements with different clamping profiles.
Figure 10:
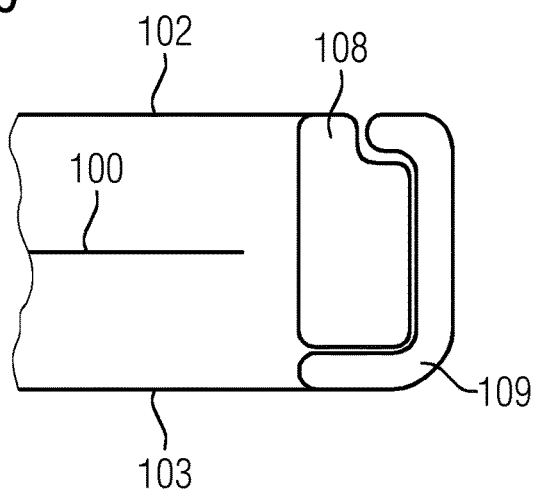
Figure 11:
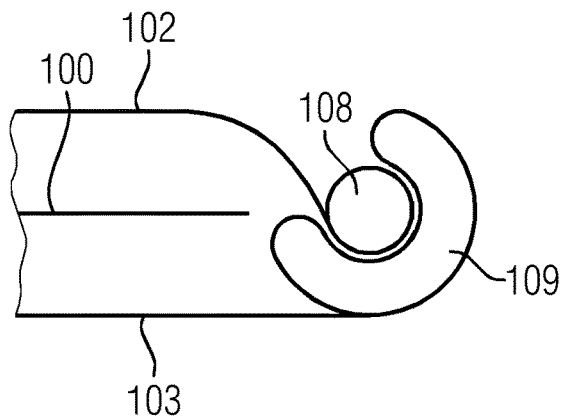

In FIGS. 9-11, the first connecting element 108 includes a first clamping profile, and the second connecting element 109 includes a second clamping profile. In a connected state, the first clamping profile is clamped in the second clamping profile.

In this case, the enclosure shells 102, 103 are provided with a type of clip, instead of a beading, at the peripheries of the cut-outs. These may be bonded to and/or thermally joined to and/or attached with a hook-and-loop fastening to the enclosure shells 102, 103, for example. Depending on the design of the two clamping profiles, the rigid area of the cut-out may be configured to be rather flat or prominent. The clip may also be clipped to itself or may have locking lugs.

FIGS. 9-11 each show just one possible cross-section of the clamping profile. According to the shape of the cut-out, the clamping profile may be configured, for example, to be circular or oval or rounded-rectangular. The enclosure shells 102, 103 of the enclosure may be connected to one another reversibly. This is achieved, for example, using a tool or by selective pressing.

FIG. 12 shows a simplified view of one embodiment of an MR local coil 200 in a flat state. However, the MR local coil 200 may also assume a curved state (e.g., if the MR local coil 200 is configured to be flexible).

The MR local coil 200 includes a support structure 117 on which multiple coil elements 114 with associated preamplifiers 115 are arranged in a fixed manner. The MR local coil 200 further includes multiple cut-outs 116. The multiple cut-outs 116 are arranged within an area that is delimited by a coil element 114 of the MR local coil 200. For example, the cut-outs 116 are arranged concentrically in relation to the respective coil elements 114.

When the enclosure 100 is arranged on the MR local coil 200, the first cut-outs 105 and/or the second cut-outs 106 may also be arranged within the area that is delimited in each case by one coil element 114 of the MR local coil 200.

In one embodiment, when the enclosure 100 is arranged on the MR local coil 200, one projection of the cut-out 116 of the support structure 117 of the MR local coil 200 lies on a projection plane, aligned parallel to the surface of the support structure 117, within a projection of the first cut-out 105 and/or of the second cut-out 106 of the enclosure on the projection plane. The projection plane may be the central plane referred to above, for example.

The support structure includes at least one cut-out arranged substantially concentrically in relation to the at least one first cut-out and/or to the at least one second cut-out of the enclosure.

In one embodiment, when the enclosure 100 is arranged on the MR local coil 200, the cut-outs 114 of the support structure 117 are arranged substantially concentrically in relation to the first cut-outs 105 and/or to the second cut-outs 106 of the enclosure 100.

The enclosure 100 described in detail above and the MR local coil 200 are merely exemplary embodiments that may be modified by a person skilled in the art in many ways without departing from the scope of the invention. In addition, the use of the indefinite article "a" or "an" does not rule out the possibility of there also being more than one of the features concerned. Likewise, the term "unit" does not exclude the possibility that the components in question consist of a plurality of interacting sub-components, which may also be spatially distributed if applicable.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. An enclosure for a magnetic resonance (MR) local coil, the enclosure comprising:
   a first enclosure shell and a second enclosure shell, the first enclosure shell being arranged opposite the second enclosure shell, wherein the first enclosure shell has at least one first cut-out, and the second enclosure shell has at least one second cut-out; and at least one connector configured to detachably connect a periphery of the at least one first cut-out to a periphery of the at least one second cut-out, wherein the at least one connector comprises:
a first connecting element arranged at the periphery of the at least one first cut-out; and
a second connecting element arranged at the periphery of the at least one second cut-out.

2. The enclosure of claim 1, wherein the first connecting element has a first thread, and the second connecting element has a second thread configured as a mating thread to the first thread.

3. The enclosure of claim 1, wherein the at least one connector includes a bayonet fastening, a screw-cap fastening, or the bayonet fastening and the screw-cap fastening, such that the first connecting element is detachably connectable to the second connecting element.

4. The enclosure of claim 1, wherein the first connecting element comprises a first edge, and the second connecting element comprises a second edge, and
wherein in a connected state, the first edge is encircled by the second edge.

5. The enclosure of claim 1, wherein the at least one connector comprises a frame with a groove, and
wherein in a connected state, the first connecting element and the second connecting element are arranged in the groove.

6. The enclosure of claim 1, wherein the first connecting element comprises a first clamping profile,
wherein the second connecting element comprises a second clamping profile corresponding to the first clamping profile, and
wherein in a connected state, the first clamping profile is clamped in the second clamping profile.

7. The enclosure of claim 1, wherein the at least one connector is configured to be moved from a separated state into a connected state, from a connected state into a separated state with aid of a tool, or a combination thereof.

8. The enclosure of claim 1, wherein the at least one connector is configured to be at least partially flexible.

9. The enclosure of claim 1, wherein the enclosure has a central plane between the first enclosure shell and the second enclosure shell, and
wherein the at least one connector is configured to be asymmetrical relative to the central plane when the first connecting element is connected to the second connecting element.

10. A magnetic resonance (MR) local coil comprising:
at least one coil element; and
an enclosure comprising:
a first enclosure shell and a second enclosure shell, the first enclosure shell being arranged opposite the second enclosure shell, wherein the first enclosure shell has at least one first cut-out, and the second enclosure shell has at least one second cut-out; and
at least one connector configured to detachably connect a periphery of the at least one first cut-out to a periphery of the at least one second cut-out, wherein the at least one connector comprises:
a first connecting element arranged at the periphery of the at least one first cut-out; and
a second connecting element arranged at the periphery of the at least one second cut-out.

11. The MR local coil of claim 10, wherein the MR local coil is configured to be flexible, flat, or flexible and flat.

12. The MR local coil of claim 10, wherein the at least one first cut-out, the at least one second cut-out, or the at least one first cut-out and the at least one second cut-out are arranged within an area that is delimited by a coil element of the of the at least one coil element.

13. The MR local coil of claim 10, further comprising a support structure on which the at least one coil element is arranged,
wherein the support structure comprises at least one cut-out, and
wherein a projection of the at least one cut-out of the support structure lies on a projection plane, aligned parallel to a surface of the support structure, within a projection of the at least one first cut-out, the at least one second cut-out, or the at least one first cut-out and the at least one second cut-out of the enclosure on the projection plane.

14. The MR local coil of claim 13, wherein the at least one coil element is arranged on the support structure in a fixed manner.

15. The MR local coil of claim 10, further comprising a support structure on which the at least one coil element is arranged, and
wherein the support structure comprises at least one cut-out arranged substantially concentrically in relation to the at least one first cut-out, the at least one second cut-out, or the at least one first cut-out and the at least one second cut-out of the enclosure.

16. The MR local coil of claim 15, wherein the at least one coil element is arranged on the support structure in a fixed manner.

17. An enclosure for a magnetic resonance (MR) local coil, the enclosure comprising:
a first enclosure shell;
a second enclosure shell being arranged opposite the first enclosure shell; and
one or more openings in the enclosure,
wherein the one or more openings are configured to be opened or closed with aid of a zip fastening, and
wherein the MR local coil is configured to be accessed via the one or more openings.

18. The enclosure of claim 17, wherein the one or more openings are positioned in the first and second enclosure shells.

* * * * *